United States Patent [19]

Taylor

[11] Patent Number: 5,327,027
[45] Date of Patent: Jul. 5, 1994

[54] CIRCUIT FOR MULTIPLYING THE VALUE OF A CAPACITOR

[75] Inventor: Stewart S. Taylor, Beaverton, Oreg.

[73] Assignee: TriQuint Semiconductor, Inc., Beaverton, Oreg.

[21] Appl. No.: 814,965

[22] Filed: Dec. 24, 1991

[51] Int. Cl.$^5$ ............................................... H03F 3/08
[52] U.S. Cl. ........................................ 307/490; 307/491; 328/127; 330/85; 330/109
[58] Field of Search ............... 330/291, 362, 75, 85, 330/86, 109; 307/490, 491; 328/127

[56] References Cited

U.S. PATENT DOCUMENTS

| | | | |
|---|---|---|---|
| 3,831,117 | 8/1974 | Fletcher et al. | 333/80 R |
| 3,911,296 | 10/1975 | Davis | 307/297 |
| 4,025,867 | 5/1977 | Seidel | 330/110 |
| 4,100,515 | 7/1978 | Gupta | 333/80 R |
| 4,301,501 | 11/1981 | Carter et al. | 363/62 |
| 4,339,729 | 7/1982 | Jason et al. | 330/306 |
| 4,587,437 | 5/1986 | Schorr | 307/109 |
| 4,709,159 | 11/1987 | Pace | 307/227 |
| 5,030,925 | 7/1991 | Taylor | 330/308 |

*Primary Examiner*—Timothy P. Callahan
*Attorney, Agent, or Firm*—Skjerven, Morrill, MacPherson, Franklin & Friel

[57] ABSTRACT

A circuit is described herein which effectively multiplies the value of a capacitor. The circuit draws current from an input node, where this current being drawn is related to the gain of an amplifier and the value of a capacitor, thus effectively amplifying the capacitance value of a capacitor as seen at the input node.

11 Claims, 3 Drawing Sheets

CIRCUIT FOR MULTIPLYING THE VALUE OF A CAPACITOR

FIELD OF THE INVENTION

This invention relates to an amplifier circuit and, more particularly, to an amplifier circuit wherein the circuit is for multiplying a capacitance value.

BACKGROUND OF THE INVENTION

Relatively high value capacitors (e.g., 100 pF or more) generally require a relatively large plate area and are more expensive to fabricate than lower value capacitors. Due to the large physical size of high value capacitors, such high value capacitors cannot be easily incorporated into an integrated circuit and thus must be connected external to an integrated circuit.

Capacitance is calculated using the equation:

$$C = AK\epsilon_O/t,$$

where
C is the capacitance
$\epsilon_O$ is the permittivity of empty space ($8.85 \times 10^{-2}$ coul$^2$/newton$^2$–m$^2$)
K is the dielectric constant (3.9 for SiO$_2$)
A is the plate area, and
t is the dielectric thickness.

As seen from the above equation, capacitance can only be significantly increased by either increasing the plate area or decreasing the thickness of the dielectric between the plates. The dielectric thickness is limited by the process used, the operating voltage, and the difficulty in achieving a consistent thin dielectric thickness over a large area.

High value capacitors may be required in circuits for achieving a desired operating bandwidth of an AC coupled amplifier, for filtering, and for other uses well known to those skilled in the art.

Thus, what is needed is a circuit and method for achieving a high capacitance value in a circuit which does not require a capacitor having a large area.

SUMMARY OF THE INVENTION

A circuit is described herein which effectively multiplies the value of a capacitor. In one embodiment of this circuit, a transconductance amplifier has an amplified current output generally proportional to a voltage across a feedback resistor of a feedback amplifier. A first terminal (acting as an input node for the circuit) of a capacitor is connected to an output of the transconductance amplifier while a second terminal of the capacitor is connected to the input of the feedback amplifier. If an AC signal from a signal source is then applied to the first terminal of the capacitor, a small current through the capacitor will cause a much larger current to be generated at the output of the transconductance amplifier. Thus, the transconductance amplifier will draw a relatively large current from the input node of the circuit proportional to the value of the capacitor. Consequently, the input of the circuit will appear to have a relatively low impedance ($Z = 1/j\omega C$) due to the value of the capacitor being effectively amplified by the transconductance amplifier in conjunction with the feedback amplifier.

Using this circuit enables one to use a relatively small value capacitor to achieve a much larger effective capacitance value.

DETAILED DESCRIPTION OF THE PREFERRED EMBODIMENTS

Figure 1:
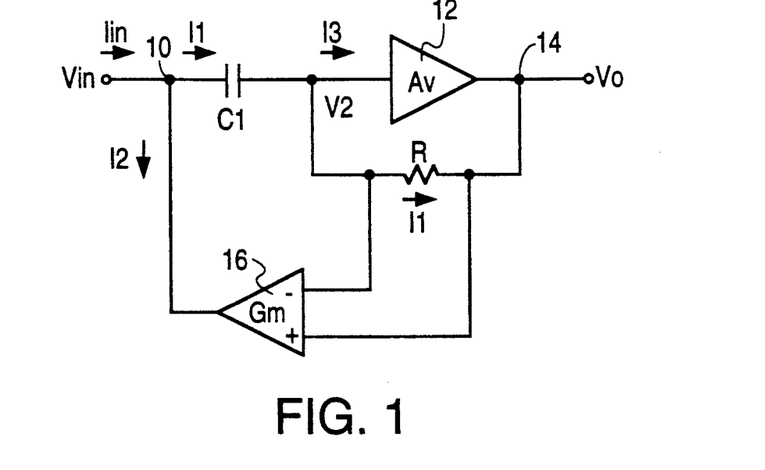
FIG. 1 shows one embodiment of a capacitance multiplier circuit in accordance with the present invention.

Shown in FIG. 1 is a circuit which generates an effective capacitance at the input node 10 of the circuit which may be much higher than the actual value of the capacitor C1. The circuit in FIG. 1 may be formed on a silicon or GaAs chip, for example, using conventional fabrication techniques and may exhibit an effective capacitance at node 10 which is larger than a capacitance which could feasibly be formed on a silicon or GaAs chip.

A first terminal of capacitor C1 is connected to input node 10, while a second terminal of capacitor C1 is connected to an input of an inverting feedback amplifier 12. Capacitor C1 may be of any value. Amplifier 12 preferably presents a relatively high impedance to an input signal, which may be assumed for purposes of explaining the operation of the circuit to be an infinite impedance. The input impedance of amplifier 12 may, however, be any value and the circuit will still operate to multiply the value of a capacitance. The output of amplifier 12 at node 14 will be a greatly amplified but inverted signal $V_0$ proportional to the voltage V2 applied to the input of amplifier 12.

A feedback resistor R is placed across the input and output terminals of amplifier 12 so that a feedback current will flow through resistor R. Resistor R is chosen in accordance with the desired transresistance and bandwidth of the circuit and draws virtually all of the current I1 flowing through capacitor C1, thus maintaining voltage V2 at a very small value. The selection of resistor R will be in accordance with feedback principles well known to those skilled in the art. For convenience in analyzing the circuit of FIG. 1 we will assume that the current I3 flowing into amplifier 12 and the voltage V2 at the input of amplifier 12 have effectively zero value, although I3 and V2 must be some value other than zero for the circuit to operate. Hence, the current I1 which flows from input node 10 through capacitor C1 is assumed to be totally diverted through resistor R so that the voltage across resistor R is effectively (R)(I1). The voltage across capacitor C1 is equal to the input voltage $V_{in}$ because V2 is assumed to be zero volts.

The voltage differential across resistor R is applied to the non-inverting and inverting inputs of a transconductance amplifier 16 having a transconductance ($I_{OUT}/V_{in}$) of Gm. The output of amplifier 16 will thus be a current I2 having a value of (I1)(Gm)(R).

For a sinusoidal signal (I1 sin ωt), the peak input voltage $V_{in}$ at node 10 is equal to $I1/j\omega C$, assuming V2 is approximated to be zero, and where C is the value of capacitor C1. The peak input current $I_{in}$ is equal to $I1+I2$. By substituting for I2, the peak input current $I_{in}$ is equal to $(I1)+(I1)(Gm)(R)$. Therefore, the impedance at the input node 10 of the circuit is $V_{in}/I_{in}=1/[(j\omega C)(1+GmR)]$. Thus, the equivalent capacitance at the input node 10 of the circuit in FIG. 1 is $C(1+GmR)$, where the circuit has thus multiplied the value of capacitor C1 by $(1+GmR)$.

As seen, by using a circuit such as shown in FIG. 1 to draw current from an input node, where this current being drawn is related to the gain of an amplifier, the value of a capacitor used in the circuit, and the current through the capacitor, the effective capacitance at the input of the circuit may be made large even when the value of capacitor C1 is small.

It is to be pointed out that for many circuits this feedback action which multiplies the value of capacitor C1 need only be operative at relatively low frequencies. This, in many cases, simplifies the circuit implementation and avoids stability problems.

Figure 2:
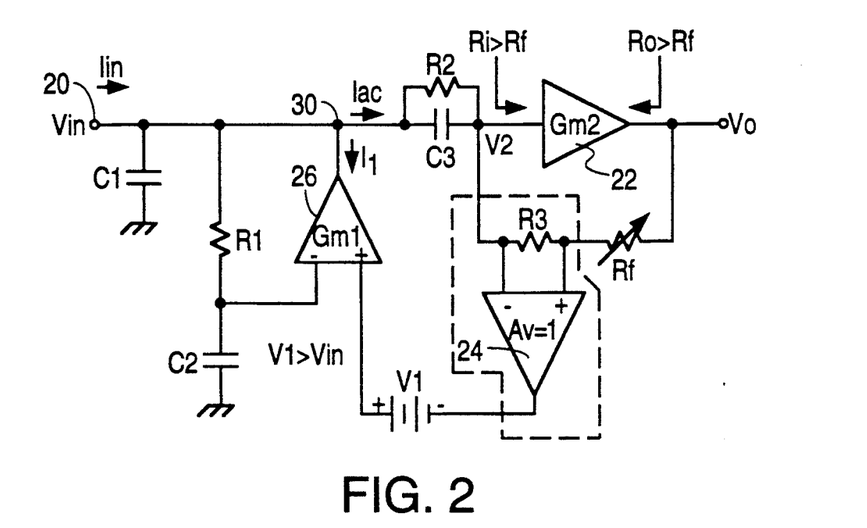
FIG. 2 shows another embodiment of a capacitance multiplier circuit incorporated into a transimpedance amplifier.

FIG. 2 illustrates an alternative embodiment of my inventive circuit for amplifying a capacitance when incorporated in a certain transimpedance amplifier, which is the subject of my U.S. Pat. No. 5,030,925, incorporated herein by reference. The portion of the circuit in FIG. 2 shown outside the dashed outline is described in col. 6, line 40, to col. 7, line 37, of my patent '925 and will not be described in detail herein. The portion of the circuit of FIG. 2 shown within the dashed outline has been added in accordance with this invention to effectively amplify the value of capacitor C3.

In the circuit of FIG. 2 the transconductance amplifier 22 and resistor R3 replace amplifier 12 and resistor R in FIG. 1, and the unity gain buffer 24 in conjunction with the transconductance amplifier 26 and bias voltage V1 replace transconductance amplifier 16 in FIG. 1. The transconductive amplifier 26 serves the dual function of removing DC current, as described in my patent '925, and amplifying a capacitance value as described below.

The transimpedance amplifier of FIG. 2 operates to produce an output voltage $V_0$ in response to an input current $I_{in}$. Capacitor C3 acts to AC couple an incoming signal to amplifier 22. It may be desired to raise the effective capacitance of capacitor C3 to provide a lower cut-off frequency for the transimpedance amplifier and/or to reduce the minimum and maximum value of $V_{in}$ under large signal conditions. Otherwise the circuit may overload and cause distortion. If an external capacitor were to be used in place of capacitor C3, any parasitic capacitance to ground from the interconnection would lower the bandwidth of the circuit and/or degrade the noise performance of the circuit.

The addition of the portion of the circuit within the dashed outline acts to raise the effective capacitance of capacitor C3 so that no external capacitor is needed.

The operation of the circuit of FIG. 2 within the dashed outline is similar to that of FIG. 1. For simplicity, it is assumed that resistors R3 and Rf are of such a value so that the input voltage V2 into amplifier 22 and the current entering amplifier 22 can be approximated to be zero. Thus, the full current $I_{AC}$ flowing through capacitor C3 will effectively be totally diverted through resistors R3 and Rf. The voltage gain of amplifier 22 will be Gm2 (R3+Rf), where Gm2 is the transconductance of amplifier 22.

Amplifier 26 sinks current from node 30 in response to a voltage difference at its input terminals. The DC biasing of amplifier 26 and its connection to the output of amplifier 24 causes amplifier 26 to absorb DC input current from node 30 to lower distortion and increase the dynamic range of the transimpedance circuit, as well as to absorb AC input current from node 30 in response to the AC current flowing through capacitor C3 so as to effectively multiply the value of capacitor C3.

The unity gain buffer 24 and bias voltage V1 cause the output of transconductance amplifier 26 to have no output current for small input signals applied to input node 20. This is important because the circuitry within the dashed outline, as well as transconductance amplifier 26, would otherwise contribute noise to the transimpedance amplifier at these small input signal levels. When the incoming voltage signal applied to node 20 is sufficiently large to cause amplifier 26 to sink current from node 30, the noise added by the circuit within the dashed outline is sufficiently small compared to the input signal $I_{in}$ so as not to significantly affect the output signal $V_0$ of the transimpedance circuit.

Figure 3A:
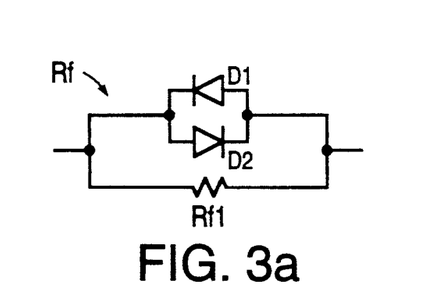
FIG. 3a is a circuit illustrating a non-linear feedback resistor which may be used in the circuit of FIG. 2.
Figure 3B:
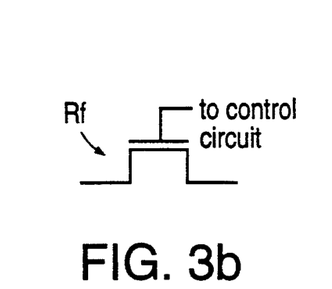
FIG. 3b is a field effect transistor which may be used as a feedback element in the circuit of FIG. 2.

The variable resistor Rf in FIG. 2, in one embodiment, may be that circuit shown in FIG. 3a, where the resistor Rf is shown to be a symmetrical nonlinear network in parallel with a linear resistor Rf1. The nonlinear network causes amplifier 22 to have a lower gain in response to a larger input signal to increase the dynamic range of the transimpedance amplifier. Another network which may be substituted for Rf in FIG. 2 is an FET, as shown in FIG. 3b, with its control terminal connected to a control circuit (not shown).

The capacitor C1 in FIG. 2 models all parasitic capacitance at node 20, and the serial network of the resistor R1 and capacitor C2 provide a filtered value of the input voltage (its DC value) at the inverting terminal of amplifier 26.

The resistor R2 across capacitor C3 allows a small average value (DC) of a current to flow into the circuit and establishes the DC voltage at node 20 when $I_{in}$ is zero. The DC voltage at node 20 is detected by the feedback circuitry and used to control amplifier 26 to remove the DC component from node 30.

Figure 4:
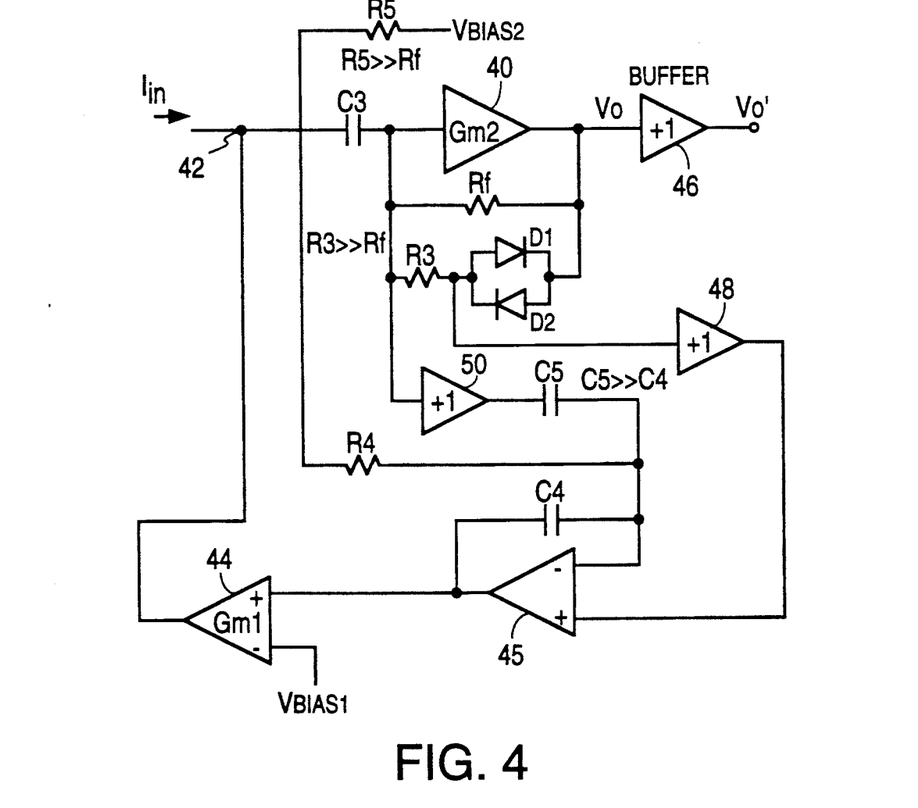
FIG. 4 is another embodiment of a transimpedance amplifier incorporating a capacitance multiplier circuit.

FIG. 4 illustrates the circuit of the present invention being incorporated in another transimpedance amplifier. In FIG. 4, the transconductance amplifier 40 and resistor R3 perform the general function of amplifier 12 and resistor R in FIG. 1.

The capacitor C3 is used to AC couple the input node 42 to the transimpedance amplifier. It is desirable to effectively increase the value of capacitor C3 to allow the circuit to operate properly under large signal, low frequency conditions. This is achieved by effectively converting the current flow through capacitor C3 into an amplified current output of amplifier 44 as previously described with respect to FIG. 1.

The voltage across resistor R3 will be related to the current flow through capacitor C3. The AC voltage across resistor R3 becomes amplified by amplifier 45, which typically has a voltage gain of ten or more, and is converted to a current by transconductance amplifier 44. This AC portion of the output current of amplifier 44 acts to effectively increase the effective capacitance of capacitor C3 to prevent the voltage across capacitor C3 from becoming too large when the input signal $I_{in}$ is large in amplitude and low in frequency.

Diodes D1 and D2 block small current signals from flowing through resistor R3. With larger AC current signals, diodes D1 and D2 alternately conduct, and the parallel connection of feedback resistors Rf and R3 lowers the gain of amplifier 40. Given the nonlinear nature of the conductance of diodes D1 and D2, the transimpedance amplifier is made to have a variable gain in response to the strength of the input signal $I_{in}$ so that the transimpedance amplifier has a wide dynamic range.

The various buffers 46, 48 and 50 have approximately unity gain. Buffer 48 may not be necessary depending on the implementation of amplifier 45. The capacitors C4 and C5 are used to block DC voltage, and capacitor C5 is chosen to be much larger than capacitor C4.

The serial combination of resistors R4 and R5 are to provide a DC bias voltage to an input of the amplifier 45 so that a DC output component of amplifier 44 will remove unwanted DC current from node 42. The value of resistor R5 is selected to be much greater than the value of resistor Rf to minimize noise.

Resistor R4, capacitor C4, and amplifier 45 form a low pass filter for the signal at node 42, which must be filtered for proper operation. Thus, amplifier 45 provides a large DC voltage gain and a low AC voltage gain for the signal coupled from node 42 through resistor R4. Because capacitor C5 is chosen to be much larger than capacitor C4, amplifier 45 provides a large AC voltage gain for the signal across resistor R3.

The performance of the circuit of FIG. 4 does not change significantly if resistor RF is instead connected in series with resistor R3, since the value of resistor Rf is much greater than the value of resistor R3.

Figure 5:
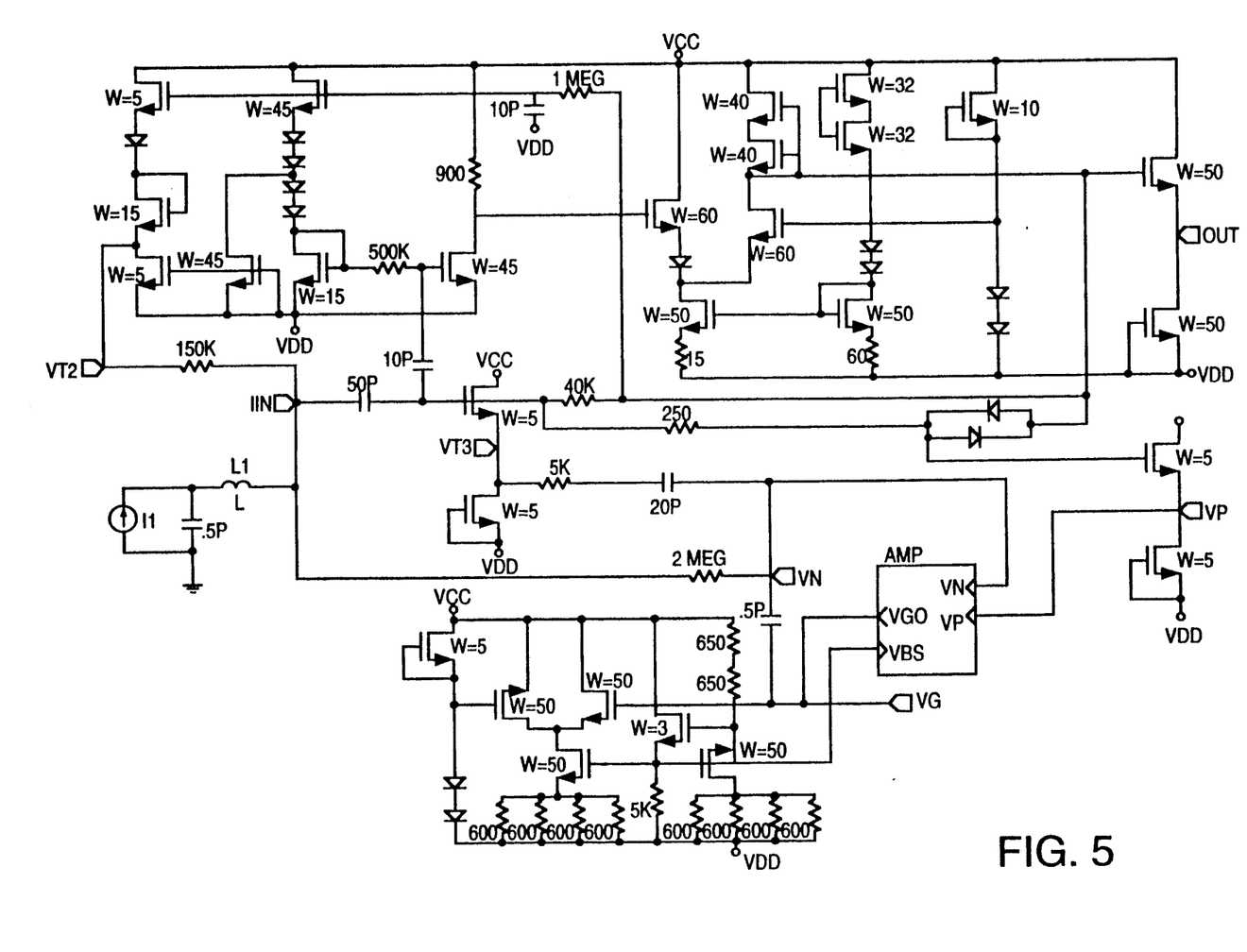
FIG. 5 is a schematic diagram illustrating an actual embodiment of the circuit of FIG. 4.

FIG. 5 is a schematic diagram of an actual embodiment of the circuit of FIG. 4.

Other circuit components may be used to implement the invention and the preferred embodiments are not intended to exhaust the possible embodiments of the invention.

While particular embodiments of the present invention have been shown and described, it will be obvious to those skilled in the art that changes and modifications may be made without departing from this invention in its broader aspects and, therefore, the appended claims are to encompass within their scope also changes and modifications as fall within the true spirit and scope of the invention.

What is claimed is:

1. A circuit for multiplying the value of a capacitor comprising:

a capacitor having a first terminal connected to a first input node of a capacitor multiplying circuit, said first input node for receiving a first input voltage;

a feedback amplifier connected to a second terminal of said capacitor for amplifying a voltage at said second terminal of said capacitor, said feedback amplifier having a current sensing element connected in a feedback path between an input terminal of said feedback amplifier and an output terminal of said feedback amplifier, said current sensing element providing a signal generally corresponding to a current which flows through said capacitor; and a conversion circuit having at least one input terminal coupled to said current sensing element, said conversion circuit having an output terminal connected to said first terminal of said capacitor, said conversion circuit providing an output current for diverting current from flowing through said capacitor and thus effectively amplifying the capacitance value of said capacitor as seen at said first input node, wherein said conversion circuit comprises a transconductance amplifier.

2. The circuit of claim 1 wherein a voltage across said current sensing element is coupled to an input terminal of said transconductance amplifier, and wherein an output terminal of said transconductance amplifier is connected to said first terminal of said capacitor.

3. The circuit of claim 2 wherein a first terminal of sand current sensing element is coupled to an inverting input of said transconductance amplifier and a second terminal of said current sensing element is coupled to a non-inverting input of said transconductance amplifier.

4. A circuit for multiplying the value of a capacitor comprising:

a capacitor having a first terminal connected to a first input node of a capacitor multiplying circuit, said first input node for receiving a first input voltage;

a feedback amplifier connected to a second terminal of said capacitor for amplifying a voltage at said second terminal of said capacitor, said feedback amplifier having a current sensing element connected in a feedback path between an input terminal of said feedback amplifier and an output terminal of said feedback amplifier, said current sensing element providing a signal generally corresponding to a current which flows through said capacitor;

a conversion circuit having at least one input terminal coupled to said current sensing element, said conversion circuit having an output terminal connected to said first terminal of said capacitor, said conversion circuit providing an output current for diverting current from flowing through said capacitor and thus effectively amplifying the capacitance value of said capacitor as seen at said first input node; and a variable impedance circuit coupled in series with said current sensing element between said input terminal and said output terminal of said feedback amplifier.

5. The circuit of claim 4 wherein said variable impedance circuit comprises a field effect transistor.

6. The circuit of claim 4 wherein said variable impedance circuit comprises a field effect transistor employed as a variable resistor.

7. A circuit for multiplying the value of a capacitor comprising:

a capacitor having a first terminal connected to a first input node of a capacitor multiplying circuit, said first input node for receiving a first input voltage;

a feedback amplifier connected to a second terminal of said capacitor for amplifying a voltage at said second terminal of said capacitor, said feedback amplifier having a current sensing element connected in a feedback path between an input terminal of said feedback amplifier and an output terminal of said feedback amplifier, said current sensing element providing a signal generally corresponding to a current which flows through said capacitor;

a conversion circuit having at least one input terminal coupled to said current sensing element, said conversion circuit having an output terminal connected to said first terminal of said capacitor, said conversion circuit providing an output current for diverting current from flowing through said capacitor and thus effectively amplifying the capacitance value of said capacitor as seen at said first input node; and a nonlinear and symmetrical impedance coupled in series with said current sensing element between said input terminal and said output terminal of said feedback amplifier.

8. A circuit for multiplying the value of a capacitor comprising:

a capacitor having a first terminal connected to a first input node of a capacitor multiplying circuit, said first input node for receiving a first input voltage;

a feedback amplifier connected to a second terminal of said capacitor for amplifying a voltage at said second terminal of said capacitor, said feedback amplifier having a current sensing element connected in a feedback path between an input terminal of said feedback amplifier and an output terminal of said feedback amplifier, wherein said feedback amplifier has a DC voltage applied to its input terminal which is substantially independent of an output DC voltage at said output terminal of said feedback amplifier, said current sensing element providing a signal generally corresponding to a current which flows through said capacitor; and a conversion circuit having at least one input terminal coupled to said current sensing element, said conversion circuit having an output terminal connected to said first terminal of said capacitor, said conversion circuit providing an output current for diverting current from flowing through said capacitor and thus effectively amplifying the capacitance value of said capacitor as seen at said first input node.

9. A method for multiplying the value of a capacitor comprising the steps of:

applying an input voltage to a first terminal of a capacitor;

amplifying a voltage at a second terminal of said capacitor so as to provide an amplified output voltage at an output terminal of a feedback amplifier;

generating a voltage across a current sensing element connected between said second terminal of said capacitor and said output terminal of said feedback amplifier, wherein substantially all current flowing through said capacitor flows through said current sensing element; and converting said voltage across said current sensing element to an output current for diverting current from flowing through said capacitor to thus effectively amplify a capacitance value of said capacitor as seen at said first terminal of said capacitor, wherein said step of converting is performed by a transconductance amplifier.

10. The method of claim 9 wherein said transconductance amplifier has an input coupled to detect a voltage across said current sensing element, and an output of said transconductance amplifier connected to said first terminal of said capacitor.

11. The method of claim 10 wherein a first terminal of said current sensing element is coupled to an inverting input of said transconductance amplifier and a second terminal of said current sensing element is coupled to a non-inverting input of said transconductance amplifier.

* * * * *

UNITED STATES PATENT AND TRADEMARK OFFICE
CERTIFICATE OF CORRECTION

Page 1 of 3

PATENT NO. : 5,327,027
DATED : July 5, 1994
INVENTOR(S) : Stewart S. Taylor

It is certified that error appears in the above-indentified patent and that said Letters Patent is hereby corrected as shown below:

Figures 4 and 5, should be deleted to be replaced with Figures 4 and 5 as shown on the attached page.

Signed and Sealed this

Eleventh Day of October, 1994

Attest:

BRUCE LEHMAN

Attesting Officer     Commissioner of Patents and Trademarks

FIG. 4

FIG. 5